United States Patent
Uehara et al.

(10) Patent No.: US 6,304,151 B1
(45) Date of Patent: Oct. 16, 2001

(54) CRYSTAL OSCILLATOR AND METHOD OF FABRICATING THE SAME

(75) Inventors: Hiroshi Uehara; Toshikatsu Makuta; Seiji Oda; Tatsunobu Shibuya; Susumu Negishi; Xinglong Gong, all of Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/651,026

(22) Filed: Aug. 30, 2000

(30) Foreign Application Priority Data

Dec. 7, 1999 (JP) .................................. 11-364979
Apr. 7, 2000 (JP) .................................. 12-106214

(51) Int. Cl.$^7$ ................. H03B 1/04; H03B 5/36

(52) U.S. Cl. ................. 331/108 D; 331/68; 331/158; 331/175

(58) Field of Search .................. 331/68, 116 R, 331/116 FE, 108 D, 158, 175, 187

(56) References Cited

U.S. PATENT DOCUMENTS 6,066,512 * 5/2000 Hashimoto ............................ 438/112

\* cited by examiner

Primary Examiner—David Mis
(74) Attorney, Agent, or Firm—Oblon, Spivak, McClelland, Maier & Neustadt, P.C.

(57) ABSTRACT

There is provided a crystal oscillator including a vessel main body having a concave portion, a cover bonded to the vessel main body so as to form an encapsulated vessel together with the vessel main body, a crystal blank held within the vessel, an IC (integrated circuit) chip containing an oscillating circuit utilizing the crystal blank and having a plurality of IC terminals on a major surface thereof, a plurality of circuit terminals formed on a bottom surface of the concave portion of the vessel main body at positions corresponding to the positions of the IC terminals, respectively. The IC chip is fixed to the bottom surface of the concave portion of the vessel main body by effecting face down bonding so that the IC terminals are bonded to the circuit terminals through bumps. At least one of the IC terminals is a group-arranged terminal including a plurality of unit terminals commonly connected to one another, and the plurality of unit terminals are s connected to corresponding circuit terminals through respective bumps.

15 Claims, 8 Drawing Sheets

FIG. 7A
FIG. 7B
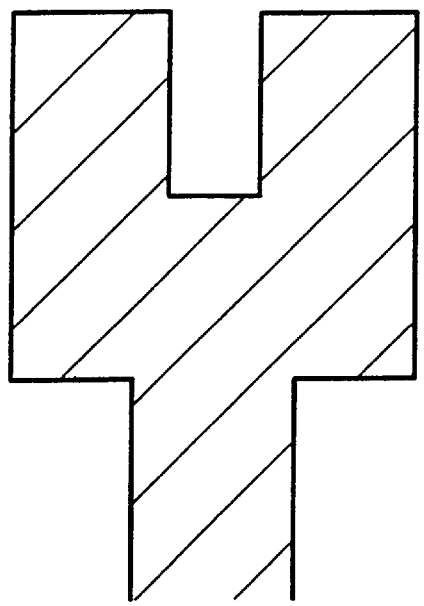
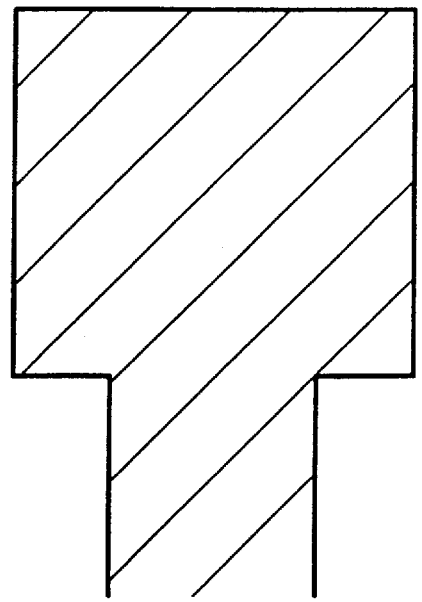

CRYSTAL OSCILLATOR AND METHOD OF FABRICATING THE SAME

BACKGROUND OF THE INVENTION

1. Field of the Invention

The present invention relates to a crystal oscillator in which a crystal blank and an IC (integrated circuit) chip are accommodated in a single vessel and a method of fabricating the same. In more particularly, the present invention relates to a crystal oscillator in which the IC chip is mounted to the vessel through a bump by using ultrasonic thermocompression bonding and a method of fabricating the same.

2. Description of the Related Art

A crystal oscillator is widely utilized as a device for providing a reference frequency and a reference time in various electronic apparatus including communication equipment. Recently, as is represented by portable equipment such as a portable telephone, the size of the apparatus becomes smaller and smaller. Thus, the crystal oscillator is also requested to be made small. The size requested for the crystal oscillator is, for example, 3 mm×5 mm for the bottom face thereof and 1 mm for the height itself. For this reason, when an IC chip included in the crystal oscillator is mounted on a package or the like, the manner of mounting is changed from a conventional wire bonding to a face down bonding (FDB) in which one major surface of the IC chip having terminal electrodes formed is brought face down and bonded to an opposing substrate. As an example of the face down bonding, there has been proposed a bonding method using ultrasonic thermocompression bonding employing a bump.

FIG. 1 is a diagram showing a cross-sectional view of an arrangement of a general crystal oscillator. FIG. 2 is a magnified cross-sectional view of a part A of FIG. 1.

A crystal oscillator is a device in which IC chip 2 and crystal blank 3 are accommodated in vessel main body 1 made of laminated ceramic and cover 4 is bonded onto vessel main body 1 so as to encapsulate therein IC chip 2 and crystal blank 3. Cover 4 is made of ceramic and bonded to vessel main body 1 at the opening face thereof with glass 10, for example. Vessel main body 1 is formed to have a concave portion. A pair of crystal terminals (not shown) are provided on the upper side wall of the concave portion serving as an open end of the concave portion. Also, a circuit pattern connected to the crystal terminal is provided on the bottom surface of the concave portion. Vessel main body 1 has outer electrodes 5 formed on the external bottom and side surfaces of vessel main body 1 so that outer electrodes 5 are connectable to a circuit pattern through a laminated layer face.

Crystal blank 3 has an excitation electrode (not shown) on each of the major surfaces. Also, crystal blank 3 has a leading electrode (not shown) which extends from the excitation electrode toward the both ends of one edge of crystal blank 3. The leading electrode is electrically and mechanically connected to the above-described crystal terminal through conductive adhesive 9, whereby crystal blank 3 can be held within the vessel main body 1.

IC chip 2 is arranged as a flip chip in which electronic circuit components are integrated together with an oscillating circuit which uses crystal blank 3. The flip chip is a so-called bare chip as it has been cut off from a semiconductor wafer such as a silicon wafer having undergone processes of semiconductor device fabrication. In the present case, IC chip 2 has a conventional arrangement suitable for achieving electrical connection by using wire bonding. That is, as shown in FIG. 3, in order to facilitate the process of wire bonding, a plurality of terminal electrodes (IC terminals) 6 are provided along a pair of sides opposing to each other on one major surface of IC chip 2. An IC terminal for power supply and an IC terminal for ground are provided at corner portions of the major surface diagonally opposing to each other, in accordance with a standard.

Now, discussion is made on a case where IC chip 2 is mounted on a package or the like by means of wire bonding. When wire bonding is employed for mounting the IC chip, a thinned wire made of gold (Au) is employed as the bonding wire. One end of the wire is connected to each of IC terminals 6. In order to decrease the electric resistance caused by the wire, particularly in the case of connection with the power supply IC terminal, unit terminals 6a and 6b each having the same size as that of an IC terminal for signal transmission, are connected to each other. Also, when an IC terminal for ground is formed on the IC chip, a pair of unit terminals 6c and 6d are connected to each other. Thus, wires can be connected in parallel, with the result that the resistance caused by the wire can be decreased to half. IC terminals include a terminal for signal output, a terminal for implementing a standby function and a terminal for connection to an external terminal or the like as well as a terminal for power supply and a terminal for ground. In the example shown in FIG. 3, a couple of unit terminals for ground and two IC terminals for signal transmission are arrayed along one side 10a of the chip. Further, a couple of unit terminals for power supply and five IC terminals for signal transmission are arrayed along the other side 10b of the chip.

While the above description was made on a case where IC chip 3 shown in FIG. 3 is mounted by means of wire bonding, the following is a description made on a case where IC chip 2 can be mounted by means of face down bonding.

When the IC chip is mounted on the package or the like by means of face down bonding, bumps 7 each having a ball-shape made of gold (Au) or the like are formed on IC terminals 6 which are necessary to be electrically connected. In general, IC chip 2 is provided with a test terminal which is utilized when IC chip 2 is subjected to test before it is mounted. However, when IC chip 2 is subjected to test, the test terminal is directly connected to a test probe or the like. Further, when IC 2 is mounted on a package or the like, it is unnecessary for the test terminal to be electrically connected to a circuit on the package. Therefore, it is unnecessary for bump 7 to be provided on the test terminal. As for IC terminals for power supply, only one of unit terminals 6a and 6b has bump 7 formed thereon. Similarly, as for IC terminals for ground, only one of unit terminals 6c and 6d has bump 7 formed thereon. This is because the manner of mounting is not wire bonding and hence there is no resistance caused by a wire. Thus, it is expected that desired electrical connection will be accomplished by forming a bump on only one of the two unit terminals connected to each other. Each of bumps 7 is brought contact to terminal electrode (circuit electrode) 8 formed at the tip end of the circuit pattern configured on the bottom surface of concave portion 1a of vessel main body 1. Thus, IC chip 2 is fixed to vessel main body 1 by means of face down bonding. In the example shown in FIG. 3, three bumps 7 in total are provided along side 10a of the major surface of the IC chip while five bumps 7 in total are provided along side 10b of the major surface of the IC chip.

Upon face down bonding of IC chip 2, of major surfaces of IC chip 2, a major surface on which a circuit, IC terminals 6 or the like are formed is brought into an opposing relationship with the bottom surface of concave portion 1a of vessel main body 1. Then, IC chip 2 and vessel main body 1 are registered with each other so that bumps 7 and circuit terminals 8 of the circuit pattern are aligned with each other. When each of bumps 7 and corresponding one of circuit terminals 8 of the circuit pattern abut against each other, ultrasonic thermocompression, for example, is effected to make bumps 7 and circuit terminals 8 be fixed to each other. Ultrasonic thermocompression is effected in such a manner that a nozzle (not shown) is applied to the center of the upper surface of the IC chip and ultrasonic wave is supplied to the IC chip while pressing the same. In this way, bumps 7 are rubbed with circuit terminals 8 while being crashed into an elliptical shape. Thus, bumps 7 are bonded to circuit terminals 8. In this case, solid phase diffusion is effected in the metal (in this case, gold) and bonding is accomplished.

If IC chip 2 is designed from the initial stage of designing without intention that the IC chip undergoes wire bonding but with intention that the IC chip undergoes face down bonding, to provide a couple of unit terminals for the IC terminals for power supply and ground is not considered as a significant matter. In other words, it is considered that a single unit terminal is sufficient for each of the IC terminals for power supply and ground, similarly to IC terminals 6 for signal transmission use. FIG. 4 shows an arrangement of an IC chip in which only one unit terminal is provided for each of the terminals for power supply and ground. FIG. 5 shows an example of a circuit pattern which is matched with IC chip 2 shown in FIG. 4 when it is provided on bottom surface 1a of vessel main body 1. Circuit pattern (conductive run) 9 is formed in such a manner that a first layer as a base electrode layer made of tungsten (W) is printed and burned, and thereafter a layer made of gold (Au) is formed by electrolytic plating on the surface of the tungsten layer. In an ordinary manner, circuit terminal portion 8 shown in FIG. 5 with half tone notation, which serves as an end contact area of the conductive run, is exposed, and portions other than the end contact area are covered with insulation material (not shown) such as alumina.

If face down bonding is employed, it becomes possible to make small the projection area of the crystal oscillator as compared with when wire bonding is employed. Further, the height of the crystal oscillator upon being mounted on a printed circuit board or the like can be decreased, which fact will contribute to high density mounting when the crystal oscillator is utilized in equipment or the like.

However, in the crystal oscillator of the above arrangement, connection between IC chip 2 and circuit terminal 8 tends to become unsatisfactory, with the result that the IC chip becomes useless though the IC chip is expensive. As a consequence, yield and productivity of the crystal oscillator are lowered.

SUMMARY OF THE INVENTION

An object of the present invention is to provide a crystal oscillator and a method of fabricating the same in which even if an IC chip is connected to a circuit terminal by using face down bonding, the IC chip becomes free from unsatisfactory connection to the circuit terminal, with the result that productivity of crystal oscillator can be improved.

We tried to analyze the cause of the above unsatisfactory connection and have accomplished the present invention. That is, the present invention is most characterized in that, of IC terminals provided on the IC chip, at least one IC terminal is arranged to be connected to the circuit terminal through two or more bumps. Then, face down bonding is effected on the IC chip arranged in this manner, whereby the IC chip is bonded to the circuit pattern formed on the vessel.

There are many possible causes of connection failure between the IC chip and the circuit terminal. One of them is unbalance between the number of bumps provided on one side of the IC chip and the number of bumps provided on the opposing side of the same. That is, the IC chip has IC terminals formed along a pair of sides opposing to each other, and bumps for effecting face down bonding are provided on the IC terminals. If the IC chip is originally designed with an intention that the IC chip is bonded by means of wire bonding, no action is taken for removing the unbalance between the number of IC terminals provided on one side of the IC chip and the number of IC terminals provided on the opposing side of the same. This is because it is expected that asymmetry in arrangement of IC terminals will not deteriorate the yield of products upon wire bonding.

However, if the IC chip originally designed with an intention that the IC chip is bonded by means of wire bonding is actually bonded by means of face down bonding in a fabrication step, the IC chip can suffer from the following problems. That is, if there is difference between the number of IC terminals provided on one side of the IC chip and the number of IC terminals provided on the opposing side of the same, there is also difference between the number of bumps provided on one side of the IC chip and the number of bumps provided on the opposing side of the same, with the result that the arrangement of IC chip lacks symmetry. As a result, pressing force deriving from the ultrasonic thermocompression effected upon face down bonding will not apply uniformly onto the IC chip, i.e., the pressing force will be unevenly concentrated on the side on which smaller number of bumps are provided. Accordingly, the bumps on the side having smaller number of bumps provided will be applied with a stronger pressing force and hence the bumps will be fixed more firmly. Conversely, the bumps on the side having larger number of bumps provided will be applied with a weaker pressing force and hence the bumps will be fixed less firmly. In the latter case, the resulting fixation stays in no more than a contacting state. If the IC chip suffers from shock, for example, electronic connection can be damaged at the IC terminal on the side having larger number of bumps and connection failure can be caused.

In order to solve the above-identified problem, one possible countermeasure is that the IC chip is designed from the initial designing stage with an intention that the IC chip undergoes the face down bonding, i.e., the IC chip is arranged to have substantially equivalent number of bumps (IC terminals) along the opposing two sides. However, a lot of development cost is required, making the IC chip disadvantageous from economical standpoint.

Therefore, we propose an arrangement in which, of IC terminals for power supply and ground each made up of two unit terminals and provided at corners of the IC chip opposing to each other diagonally, one of the IC terminals for power supply or ground is provided with two bumps on both of the two unit terminals. According to the arrangement, the bump layout restores symmetry, i.e., the number of bumps provided along one side becomes close to the number of bumps provided along the other side of the IC chip. Owing to the arrangement, the strength of fixation becomes uniform and connection failure can be avoided.

Further, we found that if parallelism between the major surface of the IC chip and the bottom surface of the vessel main body is insufficient, which fact can also cause the connection failure. The size of bump provided on the IC chip side is relatively small, e.g., about 80 μm in diameter. On the other hand, the vessel is made of ceramic and it is difficult to achieve satisfactory flatness on the bottom surface of the concave portion. Therefore, the unevenness of the bottom surface of the concave portion makes it difficult to keep parallelism between the bottom surface of the vessel main body and the major surface of the IC chip at the circuit terminals and bumps, with the result that a bump tends to fail connection to the circuit terminal.

We also propose an arrangement in which each IC terminal provided on the IC chip side is arranged to have a plurality of unit terminals electrically connected to one another, and each of the unit terminals is provided with a bump. If each of IC terminals is arranged to have a plurality of unit terminals connected to one another and each of the unit terminals is provided with a bump, one of the bumps suffering from connection failure thereat can be recovered by another bump which satisfactorily achieves electrical connection to the circuit terminal. Therefore, electrical connection can be more positively assured at every IC terminal. Accordingly, it becomes possible to reduce the possibility of connection failure as a whole.

In the present specification, the IC terminal arranged to have a plurality of unit terminals connected to one another is referred to as a group-arranged terminal.

BRIEF DESCRIPTION OF THE DRAWINGS

FIGS. 7A and 7B are diagrams each showing a plan view of an example of a shape of an end contact area, that is, a circuit terminal, formed at the tip end of a circuit pattern;

DESCRIPTION OF THE PREFERRED EMBODIMENTS

Figure 1:
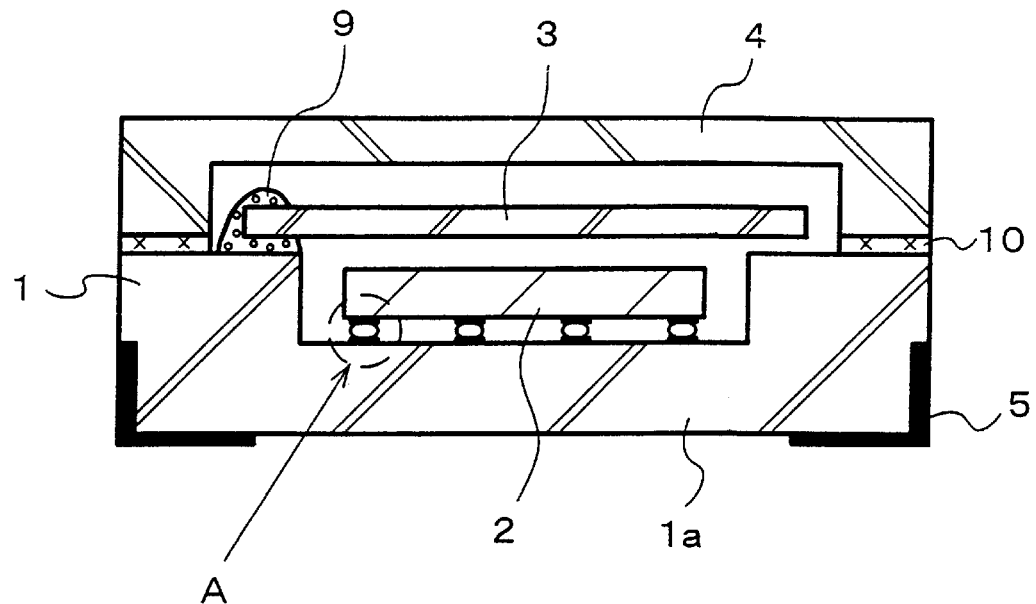
FIG. 1 is a diagram schematically showing a cross-sectional view of an arrangement of a general crystal oscillator.
Figure 2:
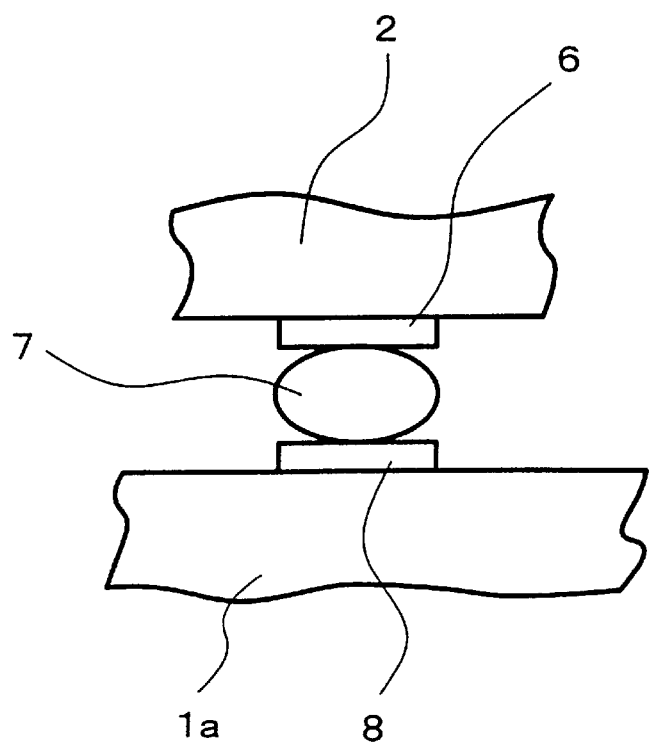
FIG. 2 is a diagram showing a magnified view of a part of a cross-section of an IC chip and a bottom portion of a vessel main body.
Figure 6:
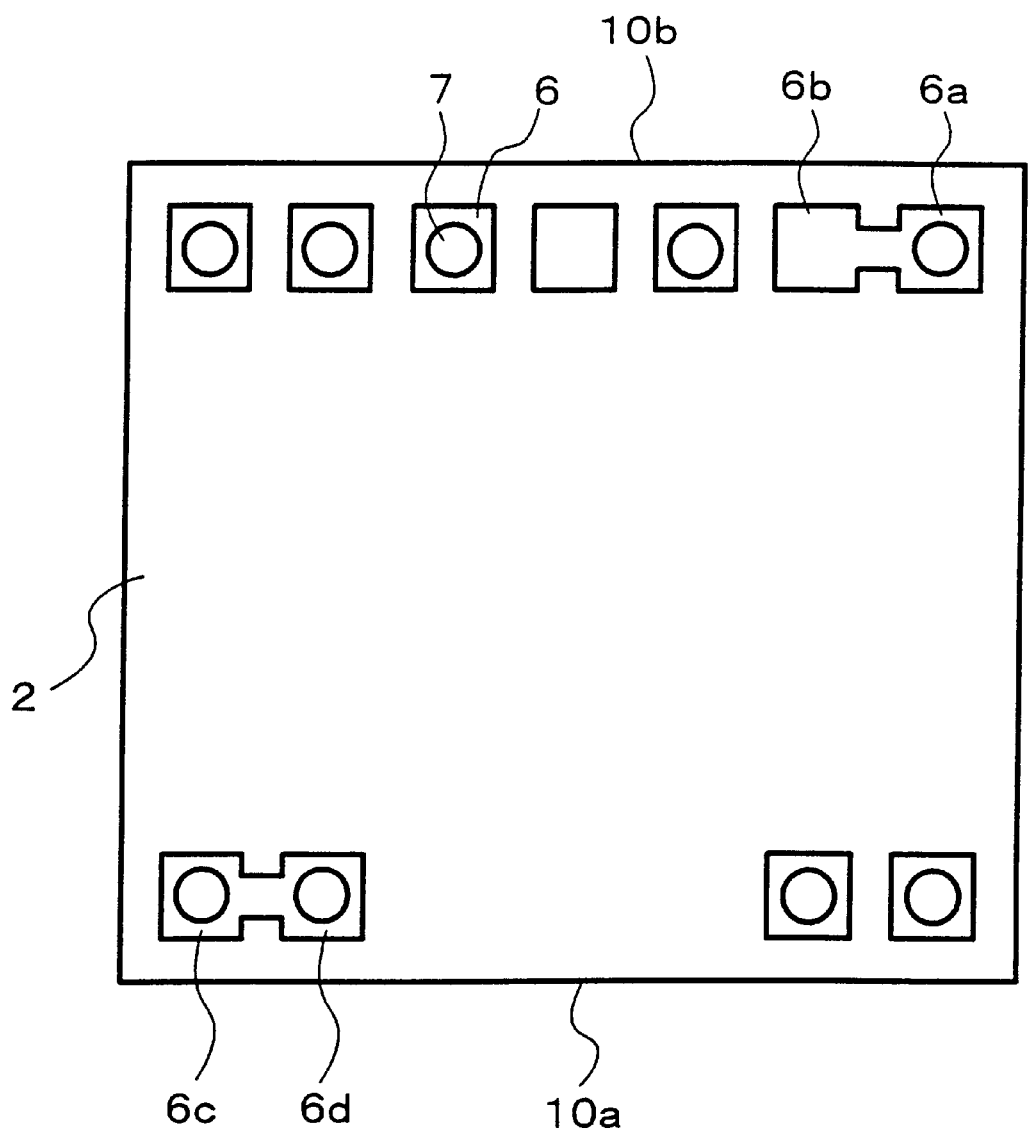
FIG. 6 is a diagram showing a plan view for explaining a layout of IC terminals and bumps on an IC chip utilized in a first embodiment of the present invention.

A crystal oscillator according to a first embodiment of the present invention has the same cross-sectional structure as that shown in FIG. 1. That is, the crystal oscillator according to the first embodiment of the present invention includes IC chip 2, IC terminal 6 formed on IC chip 2, bump 7, vessel main body 1 having concave portion 1a for accommodating IC chip 2, and circuit terminal 8 formed on bottom surface 1a. These components are constructed in a manner similar to that illustrated in FIG. 2. However, the crystal oscillator according to the first embodiment of the present invention is different from the crystal oscillator shown in FIGS. 1 and 2 in the layout of IC terminals 6 and bumps 7 of IC chip 2. Further, in correspondence to the difference in the layout of bumps, a different configuration is applied to the shape of end contact area, that is, circuit terminal, formed at each tip end of a circuit pattern formed on the bottom surface of concave portion 1a of vessel main body 1. The difference between the crystal oscillator of the present embodiment and the crystal oscillator shown in FIGS. 1 and 2 will be clearly understood by studying FIG. 6. In the following description, components attached with the same reference numerals as those of FIGS. 1 to 5 have the same arrangement as those illustrated in FIGS. 1 to 5.

In the crystal oscillator of the present embodiment, similarly to the arrangement shown in FIG. 1, crystal blank 3 is held by an upper side wall portion of vessel main body 1. IC chip 2 is originally designed with an intention that the IC chip is mounted by means of wire bonding in a fabrication step. However, in the present embodiment, IC chip 2 is fixed to the bottom surface of concave portion 1a of vessel main body 1 by means of face down bonding. Similarly to the IC chip illustrated in FIG. 3, IC chip 2 utilized in the present embodiment has a square shape. Along one side 10a of a pair of sides 10a and 10b opposing to each other, there are arrayed a couple of unit terminals 6c and 6d adjacent to each other as an IC terminal for ground. Other two IC terminals 6 are also arrayed along side 10a. Along the other side 10b, there are arrayed a couple of unit terminals 6a and 6b adjacent to each other as an IC terminal for power supply. Other five IC terminals 6 are also arrayed along side 10b. Each of the IC terminal for power supply and IC terminal for ground is configured as a group-arranged terminal including two unit terminals. The IC terminal for power supply and IC terminal for ground are respectively provided at corners of the IC chip diagonally opposing to each other.

Figure 3:
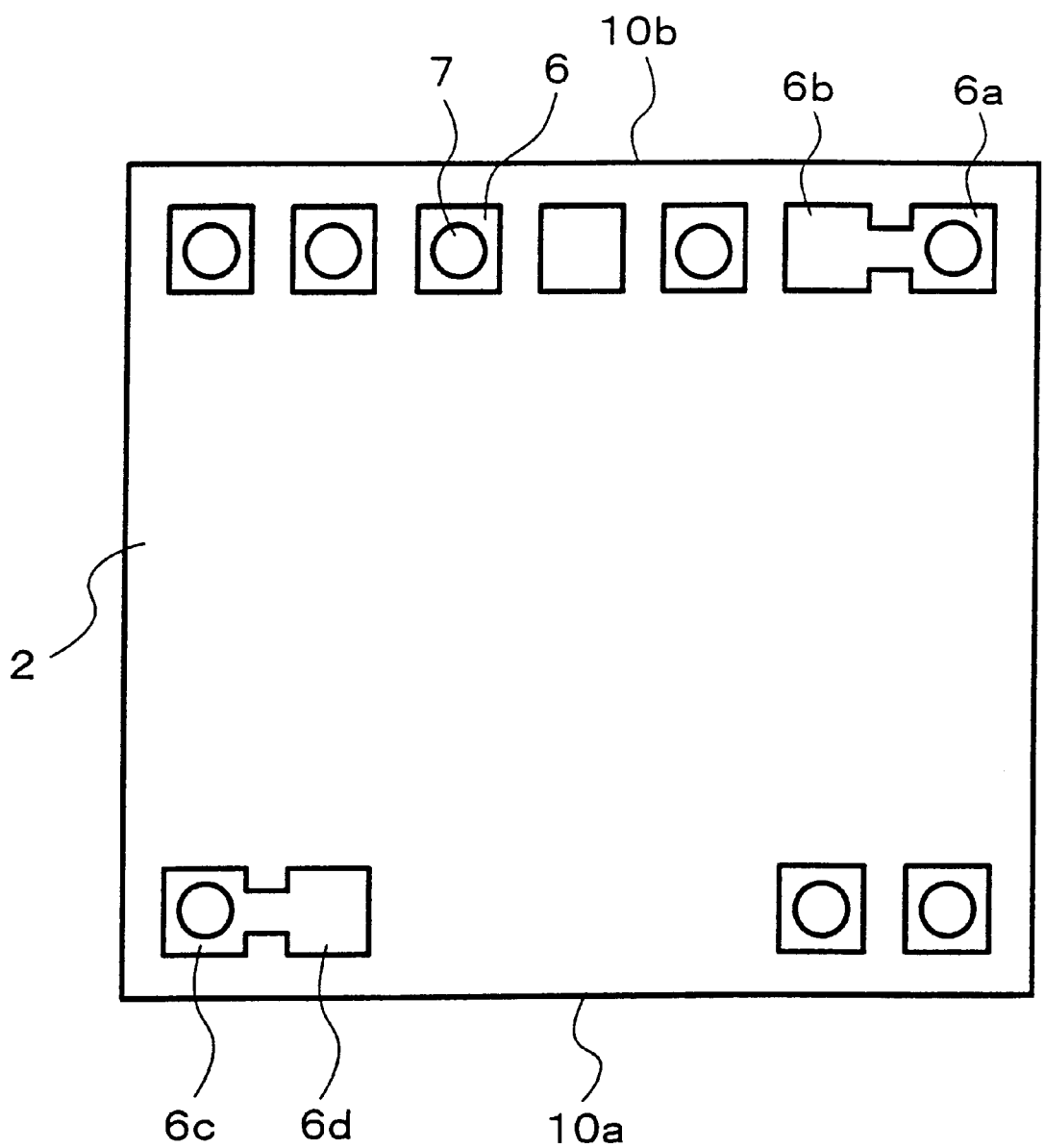
FIG. 3 is a diagram showing a plan view of one layout example of IC terminals and bumps on an IC chip.
Figure 4:
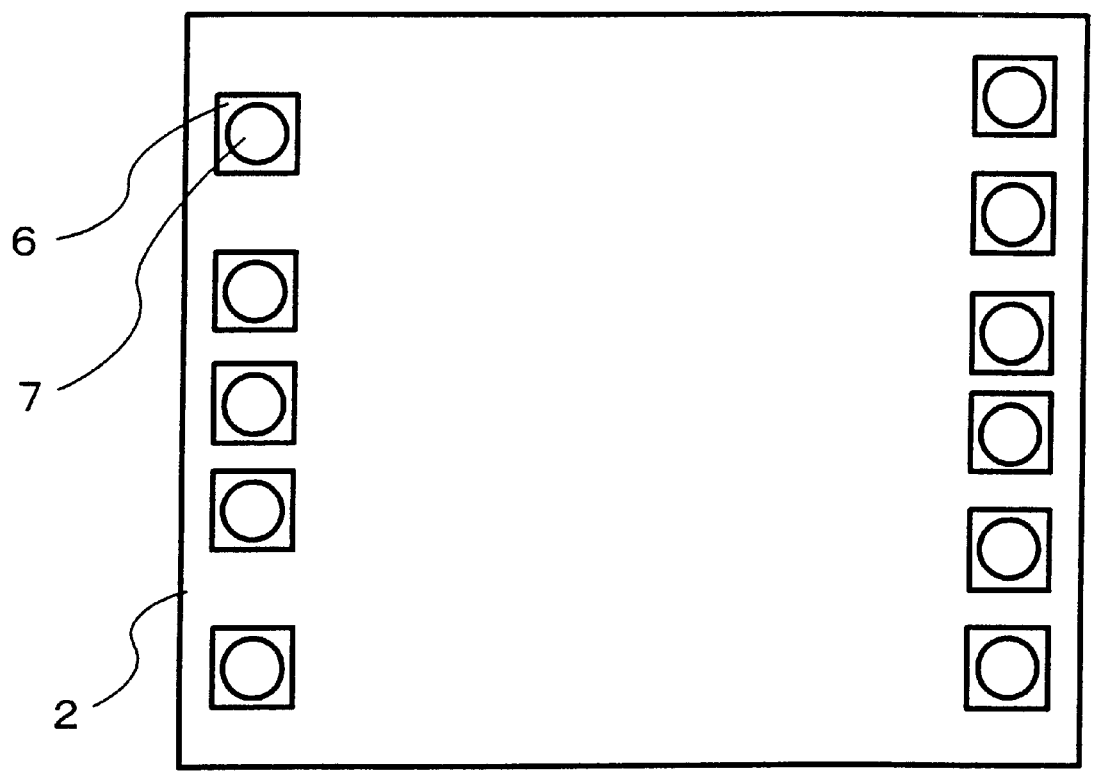
FIG. 4 is a diagram showing a plan view of another layout example of IC terminals and bumps on an IC chip.
Figure 5:
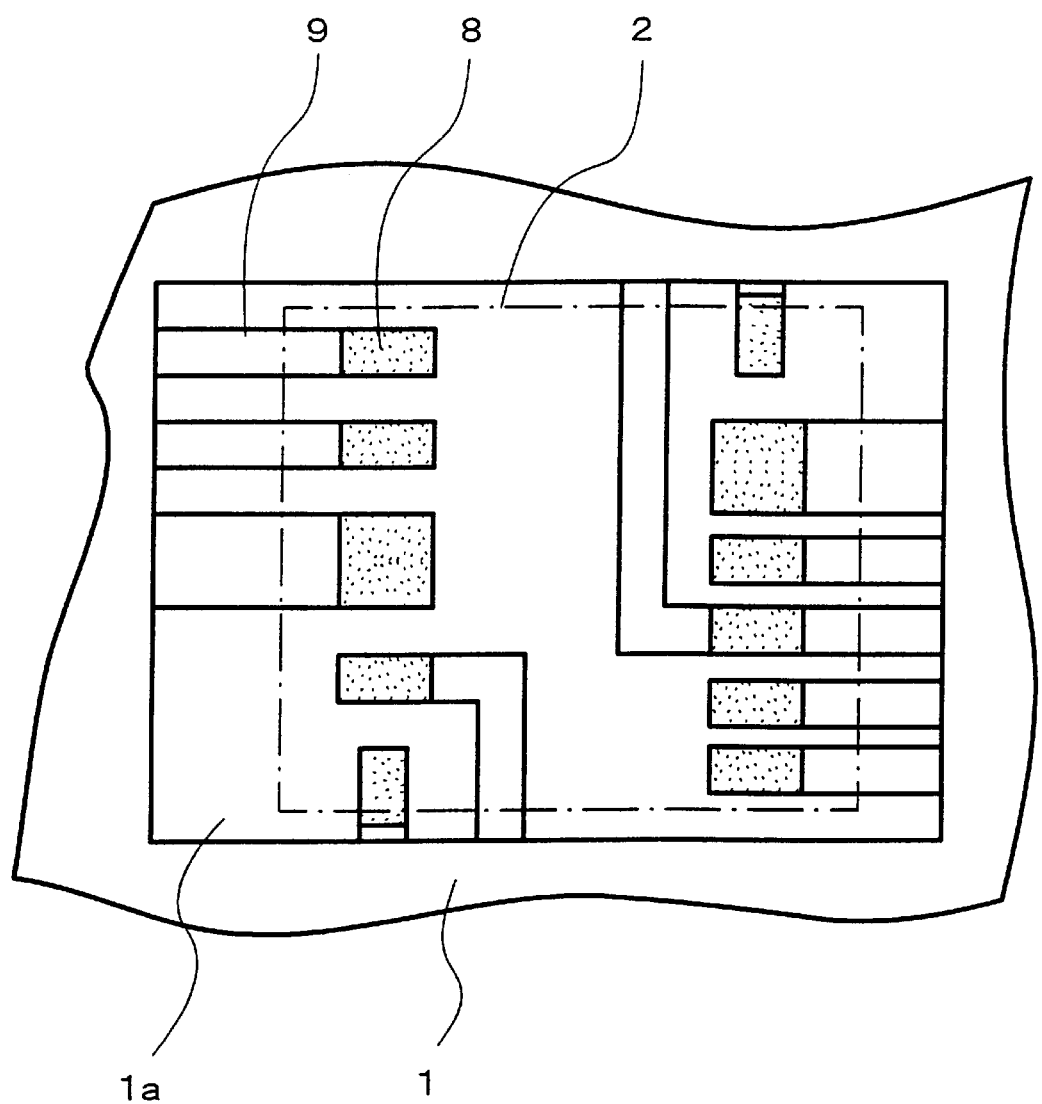
FIG. 5 is a diagram showing a plan view of one circuit pattern example formed on a bottom surface of a concave portion of a vessel main body.

IC chip 2 of the present embodiment is different from the IC chip shown in FIG. 3 in the arrangement of bumps 7 provided on the IC terminals. As shown in FIG. 3, there are three bumps 7 provided along side 10a and five bumps 7 provide along side 10b. However, in the arrangement shown in FIG. 6, bumps 7 are provided on both of unit terminals 6c and 6d constituting the IC terminal for ground situated on side 10a, which has a smaller number of bumps provided. Conversely, as for side 10b which originally has a larger number of bumps provided, bumps 7 are provided on only one of unit terminals 6a and 6b constituting the IC terminal for power supply. With the above arrangement, the total number of bumps provided along side 10a becomes four while the total number of bumps provided along side 10b becomes five.

With the above arrangement, the number of bumps 7 arrayed along side 10a becomes four, which is close to the number of bumps 7 arrayed along side 10b, i.e., five. Therefore, the layout of bump on both the sides of IC chip 2 acquires a balanced state and becomes more stable in terms of the number of bumps 7. Therefore, when ultrasonic thermocompression is effected upon bonding the IC chip on the vessel, the pressing force can be prevented from being applied in an extremely unbalanced state between sides 10a and 10b. Thus, bumps 7 arrayed along side 10a and bumps 7 arrayed along side 10b will be uniformly crashed in a similar manner, and fixing strength will be improved. Accordingly, it becomes possible to avoid connection failure due to shock or the like and improve reliability of the crystal oscillator. Moreover, according to the above arrangement, it is unnecessary for the IC chip to be newly designed with an intention that the IC chip can undergo fabrication process using face down bonding. Thus, more merit can be expected from the above arrangement of the invention from an economical standpoint.

As described above, IC chip 2 shown in FIG. 6 has unit terminals 6c and 6d for ground, and bumps 7 are formed on both of the unit terminals 6c and 6d. Therefore, in correspondence to the arrangement, circuit terminals 8 of the circuit pattern to be formed on the bottom surface of concave portion 1a of vessel main body 1 are configured to have an end contact area for ground such that the circuit terminal for ground is connectable by supporting the couple of bumps 7 at a time. FIGS. 7A and 7B are diagrams each showing a configuration of the end contact area satisfying the above request. The configuration of the circuit terminal shown in FIG. 7A is such one that the circuit terminal of the circuit pattern is formed into a two-way branched shape as a fork and end contact area is formed at each end of the two-way branch so as to support bump 7. The configuration of the circuit terminal shown in FIG. 7B is such one that the circuit terminal of the circuit pattern is formed to have an end contact area of a square shape large enough to support two bumps 7. That is, in comparison with that the end contact area shown in FIG. 7A has a width sufficient for supporting only one bump, the end contact area of FIG. 7B is so formed into a substantial square having twice the length of a side of a square which is capable of supporting a single bump, for example.

A circuit pattern having an end contact area configured as shown in FIGS. 7A or 7B is provided on the bottom surface of the concave portion 1a of the vessel main body 1. Thus, the circuit pattern is made connectable to a couple of bumps combined with each other as an IC terminal for ground, and pressing force upon effecting ultrasonic thermocompression can be uniformly applied on the IC chip, with the result that electrical connection between the IC chip and the circuit pattern can be satisfactorily achieved.

In the above-described example, bumps 7 are formed on both of unit terminals 6c and 6d of the IC terminal for ground so that the number of bumps provided along side 10a, which is smaller than the number of bumps provided along side 10b, becomes close to the number of bumps provided along side 10b. However, if the number of bumps provided along side 10b is originally smaller than the number of bumps provided along side 10a, the bump may be provided only one of unit terminals 6c and 6d of the IC terminal for ground and both of unit terminals 6a and 6b of the IC terminal for power supply.

In the above embodiment, the manner of carrying out face down bonding is not limited to the ultrasonic thermocompression bonding but bonding may be attained by using thermocompression bonding without ultrasound application. That is, any method can be employed to take advantage of the above method of the present invention so long as the bonding method is one including a step of bonding the IC chip while pressing the same.

Unit terminals 6c and 6d of the IC terminal for ground may not be connected to each other but they may be separated from each other. Further, the number of unit terminals constituting each of the IC terminals for power supply and ground may not be limited to two but three or more unit terminals may constitute each of the IC terminals for power supply and ground.

A second embodiment of the present invention will hereinafter be described. If the bottom surface of the concave portion of the vessel main body is not satisfactorily maintained flat and connection failure between the IC chip and the circuit pattern is caused by the unsatisfactory flatness, it is insufficient as a countermeasure for recovering connection failure to additionally provide a bump on the IC terminal for power supply or ground, as described in the first embodiment. According to the second embodiment of the present invention, each of the IC terminals provided on the IC chip is made as a group-arranged terminal so that the IC chip is connected to a circuit pattern through a plurality of bumps at every IC terminal. In correspondence with the arrangement of the IC chip, the circuit pattern on the bottom surface of the concave portion of the vessel main body is also modified. The arrangement of the crystal oscillator of the second embodiment is similar to that of the first embodiment in other points.

According to the arrangement of the second embodiment, since the IC chip is connected to the circuit pattern through a plurality of bumps at every IC terminal, any bump among group-arranged unit terminals achieving satisfactory connection between the IC chip and the circuit pattern will recover a bump among group-arranged unit terminals suffering from connection failure, with the result that a normal electrical connection between the IC chip and the circuit pattern will be guaranteed as a whole. Thus, yield of products can be remarkably improved.

In more concretely, each of the IC terminals is made up of a plurality of unit terminals electrically connected to one another and a bump is provided on every unit terminals. In an example shown in FIG. 8, each of IC terminals 6 provided on one major surface of IC chip 2 is made up of two unit terminals 11a and 11b electrically connected to each other. Each of unit terminals 1a and 11b is formed into a square large enough to support single bump 7. Unit terminals are arrayed along the side direction of IC chip 2. Electrical connection between the couple of unit terminals is attained at the surface of IC chip 2. Bumps 7 are provided on both of unit terminals 11a and 11b. Electrical connection between the couple of unit terminals may be established by an internal connection of IC chip 2.

In correspondence with the arrangement of IC terminal 6 of IC chip 2 as described above, the circuit terminals of the circuit pattern are configured on the bottom surface of concave portion 1a of vessel main body 1 so that an end contact area formed at each end of the circuit terminal is connectable to bumps 7 provided on couple of unit terminals 11a and 11b of a common IC terminal 6. A circuit pattern to be formed on the bottom surface of concave portion 1a of vessel main body 1 may be configured to have the end contact area shown in FIGS. 7A and 7B so that the circuit pattern attains electrical connection with the IC terminal 6 shown in FIG. 8. When bumps 7 on IC chip 2 are brought to the circuit pattern on the bottom surface of concave portion 1a of vessel main body 1 and ultrasonic thermocompression is effected thereto, then bumps 7 are bonded to circuit terminal portion 8 which is branched on the bottom surface of the concave portion. If electrical connection is established in the arrangement, since bumps 7 are provided on both of unit terminals 11a and 11b of a common IC terminal 6 and both of the bumps are subjected to bonding operation together with the circuit terminal 8, it is expected that at least one of the couple of bumps assures electrical connection between IC chip 2 and the circuit pattern formed on the bottom surface of concave portion 1a. Thus, the electrical connection between them can be more positively assured and connection failure can be more positively avoided.

Figure 8:
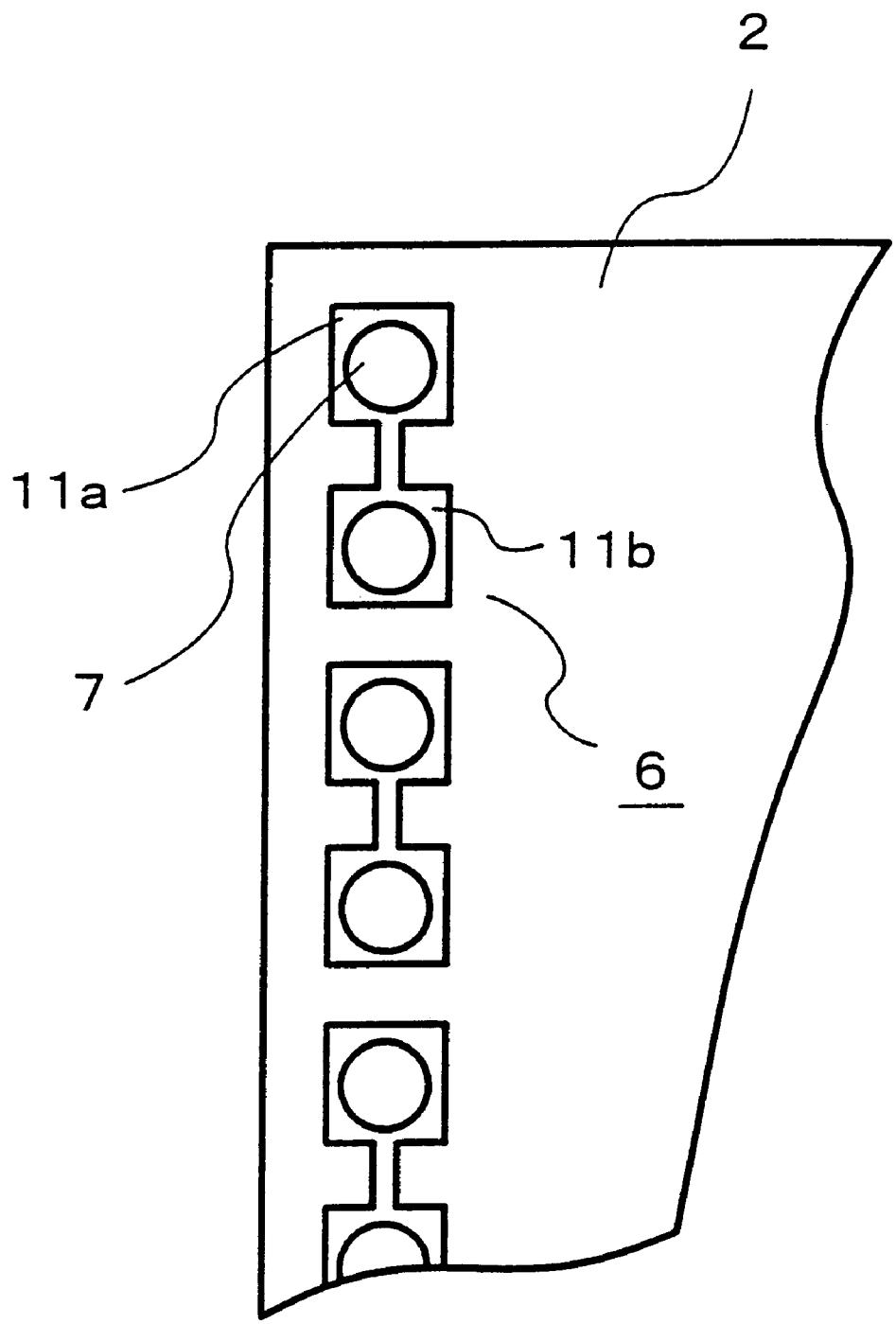
FIG. 8 is a diagram showing one example of a shape of an IC terminal formed on an IC chip according to a second embodiment of the present invention.
Figure 9:
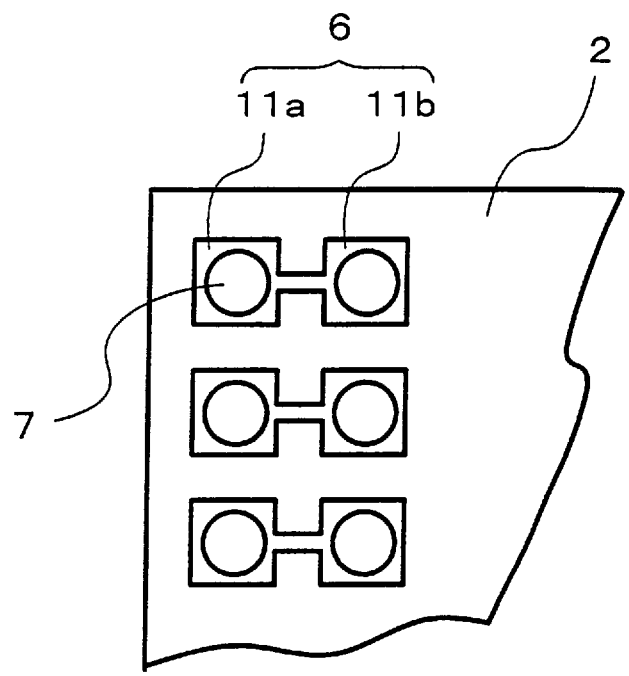
FIG. 9 is a diagram showing another example of a shape of an IC terminal formed on an IC chip according to a second embodiment of the present invention.

In the example shown in FIG. 8, unit terminals 11a and 11b are arrayed along the side direction of IC chip 2. If all of the IC terminals 6 having this arrangement are arrayed along one side of IC chip 2, a considerable number of unit terminals are arrayed in the longitudinal direction along the side. As a consequence, bumps provided on the unit terminals are crowded in the longitudinal direction. Therefore, as shown in FIG. 9, the couple of unit terminals 11a and 11b may be arrayed in a direction perpendicular to the side direction in which the IC terminals are arrayed.

Figure 10:
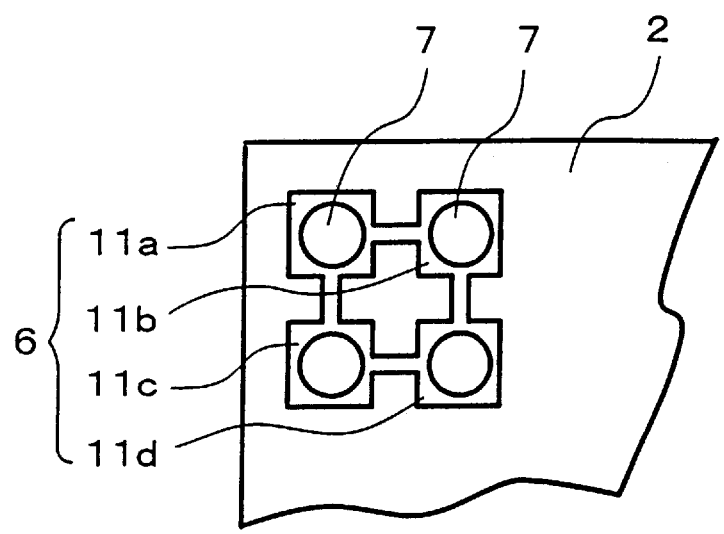
FIG. 10 is a diagram showing still another example of a shape of an IC terminal formed on an IC chip according to a second embodiment of the present invention.

Further, the umber of unit terminals arranged as a group for constituting one IC terminal 6 may not be limited to two but arbitrary number, e.g., four unit terminals may be arranged as a group for constituting one IC terminal 6. FIG. 10 shows an example in which one IC terminal 6 is made up of four unit terminals 11a to 11d and bump 7 is provided on each of the four unit terminals. It is true that connection assurance will be improved in proportion to the increase of number of unit terminals constituting one IC terminal. However, a wider area is required on the bottom surface of concave portion 1a of vessel main body 1 as the increase of the number of bumps 7 provided on each of the unit terminals constituting one IC terminal, which fact serves as an obstacle when the crystal oscillator is made small. Thus, two unit terminals constituting one IC terminal is the most reasonable choice when the merit and demerit of the increase of the number of bumps 7 are taken into account. Further, it is not necessary for all of IC terminals 6 to be made up of a plurality of unit terminals but only a IC terminal selected depending on necessity may be made up of a plurality of unit terminals.

While in the above-described crystal oscillator of the preferable embodiment according to the present invention the crystal blank is supported at one side thereof on the upper side wall of vessel main body 1, the side wall may be provided with a step and crystal blank 3 may be supported thereon. Further, a leading electrode may be provided so as to extend at both the end of crystal blank 3 and crystal blank 3 is supported at both the side thereof. Further, in the above-described embodiment IC chip 2 and crystal blank 3 are accommodated in the concave portion provided in one major surface side of the vessel main body, the vessel main body may be arranged to have concave portions in both of the major surface sides and the IC chip and the crystal blank may be separately accommodated in respective concave portions.

While the above description is made with an example of a crystal oscillator, the method of the present invention can be widely applied to any electronic devices in which an IC chip having a plurality of unit terminals for ground and/or a plurality of unit terminals for power supply is mounted on a package or the like.

What is claimed is:

1. A crystal oscillator comprising:
   a vessel main body having a concave portion;
   a cover bonded to the vessel main body so as to form an encapsulated vessel together with the vessel main body;
   a crystal blank held within the vessel;
   an IC (integrated circuit) chip containing an oscillating circuit utilizing the crystal blank and having a plurality of IC terminals on a major surface thereof; and
   a plurality of circuit terminals formed on a bottom surface of the concave portion of the vessel main body at positions corresponding to the positions of the IC terminals, respectively; wherein
   the IC chip is fixed to the vessel main body on the bottom surface thereof such that the IC terminals are bonded to the circuit terminals, respectively, through bumps, and at least one of the IC terminals is a group-arranged terminal including a plurality of unit terminals commonly connected to one another, and each of the plurality of unit terminals is connected to a corresponding one of the circuit terminals through the bump.

2. A crystal oscillator according to claim 1, wherein a circuit terminal corresponding to the group-arranged terminal is formed into a shape which is capable of completely supporting all of the bumps serving for bonding the circuit terminal to the plurality of unit terminals constituting the group-arranged terminal.

3. A crystal oscillator according to claim 1, wherein the group-arranged terminal is made up of two unit terminals.

4. A crystal oscillator according to claim 3, wherein a circuit terminal corresponding to the group-arranged terminal is two-way branched and an end contact area is formed at each end of the branches so as to support a bump.

5. A crystal oscillator according to claim 3, wherein a circuit terminal corresponding to the group-arranged terminal is formed to have an end contact area of a substantial square shape having twice the length of a side of a square which is capable of supporting a single bump.

6. A crystal oscillator according to claim 1, wherein the group-arranged terminal is made up of four unit terminals which are arrayed in a two by two matrix fashion.

7. A crystal oscillator according to claim 1, wherein the IC chip is a bare chip.

8. A crystal oscillator according to claim 1, wherein the IC chip is formed into a substantially rectangular shape having the IC terminals arrayed along a pair of sides opposing to each other.

9. A crystal oscillator according to claim 8, wherein the IC chip has an IC terminal for power supply and an IC terminal for ground formed on corner portions of the IC chip diagonally opposing to each other,
   each of the IC terminal for power supply and the IC terminal for ground is made up of two unit terminals, and
   one of the IC terminal for power supply and the IC terminal for ground is connected to the circuit terminal at only one unit terminal through a bump and the other of the IC terminal for power supply and the IC terminal for ground is connected to the circuit terminal at two unit terminals through respective bumps.

10. A crystal oscillator according to claim 9, wherein a circuit terminal corresponding to one of the IC terminal for power supply and the IC terminal for ground which is made up of two unit terminals and connected to the circuit terminals through respective bumps, is formed into a shape which is capable of completely supporting two bumps.

11. A crystal oscillator according to claim 10, wherein a circuit terminal corresponding to one of the IC terminal for power supply and the IC terminal for ground which is made up of two unit terminals and connected to the circuit terminals through respective bumps, is two-way branched and an end contact area is formed at each end of the branches so as to support a bump.

12. A crystal oscillator according to claim 10, wherein a circuit terminal corresponding to one of the IC terminal for power supply and the IC terminal for ground which is made up of two unit terminals and connected to the circuit terminals through respective bumps, is formed to have an end contact area of a substantial square shape having twice the length of a side of a square which is capable of supporting a single bump.

13. A method of fabricating a crystal oscillator including a vessel main body having a concave portion, a cover bonded to the vessel main body so as to form an encapsulated vessel together with the vessel main body, a crystal blank held within the vessel, an IC (integrated circuit) chip containing an oscillating circuit utilizing the crystal blank and having a plurality of IC terminals on a major surface thereof, a plurality of circuit terminals formed on a bottom surface of the concave portion of the vessel main body at positions corresponding to the positions of the IC terminals, respectively, the method comprising the step of:

effecting face down bonding on the IC chip so that the IC terminals are bonded to the circuit terminals through bumps, whereby the IC chip is fixed to the bottom surface of the concave portion of the vessel main body, wherein at least one of the IC terminals is a group-arranged terminal including a plurality of unit terminals commonly connected to one another, and each of the plurality of unit terminals is connected to a corresponding one of the circuit terminals through the bump.

14. A method of fabricating a crystal oscillator according to claim 13, wherein the face down bonding is effected by means of ultrasonic thermocompression bonding.

15. A method of fabricating a crystal oscillator according to claim 14, wherein the IC chip is formed into a substantially rectangular shape having an IC terminal for power supply and an IC terminal for ground formed on corner portions of the IC chip diagonally opposing to each other, each of the IC terminal for power supply and the IC terminal for ground is made up of two unit terminals, and one of the IC terminal for power supply and the IC terminal for ground is connected to the circuit terminal at one unit terminal through a bump and the other of the IC terminal for power supply and the IC terminal for ground is connected to the circuit terminal at two unit terminals through respective bumps.

\* \* \* \* \*

UNITED STATES PATENT AND TRADEMARK OFFICE
CERTIFICATE OF CORRECTION

PATENT NO.   : 6,304,151 B1
DATED        : October 16, 2001
INVENTOR(S)  : Uehara et al.

It is certified that error appears in the above-identified patent and that said Letters Patent is hereby corrected as shown below:

<u>Title page,</u>
Item [30], the Foreign Application Priority Data should read:
-- [30]             Foreign Application Priority Data
Dec. 7, 1999    (JP) .................................................. 11-346979
Apr. 7, 2000    (JP) .................................................. 2000-106214 --

Signed and Sealed this

Twenty-eighth Day of May, 2002

Attest:

Attesting Officer

JAMES E. ROGAN
*Director of the United States Patent and Trademark Office*